(12) United States Patent
Misawa et al.

(10) Patent No.: US 6,417,574 B1
(45) Date of Patent: Jul. 9, 2002

(54) SURFACE-ACOUSTIC-WAVE DEVICE FOR FLIP-CHIP MOUNTING

(75) Inventors: Kiyohide Misawa; Osamu Kawachi; Hiroyuki Furusato; Masanori Ueda, all of Suzaka (JP)

(73) Assignee: Fujitsu Media Devices Limted, Suzaka (JP)

( * ) Notice: Subject to any disclaimer, the term of this patent is extended or adjusted under 35 U.S.C. 154(b) by 30 days.

(21) Appl. No.: 09/635,094

(22) Filed: Aug. 9, 2000

(30) Foreign Application Priority Data

Aug. 11, 1999 (JP) ............................................ 11-227429

(51) Int. Cl.⁷ .............................................. H01L 23/48

(52) U.S. Cl. ........................ 257/778; 257/779; 257/780; 257/737; 257/738; 333/193; 333/195; 310/313 R

(58) Field of Search ................................ 257/778, 779, 257/780, 737, 738; 333/193, 195; 310/313 R

(56) References Cited

U.S. PATENT DOCUMENTS

| | | | | |
|---|---|---|---|---|
| 5,699,027 A | * | 12/1997 | Tsuji et al. | 333/193 |
| 5,925,931 A | * | 7/1999 | Yamamoto | 257/737 |
| 5,956,606 A | * | 9/1999 | Burnette | 438/615 |
| 6,137,380 A | * | 10/2000 | Ushiroku et al. | 333/193 |

\* cited by examiner

*Primary Examiner*—David L. Talbott
*Assistant Examiner*—Luan Thai
(74) *Attorney, Agent, or Firm*—Armstrong, Westerman & Hattori, LLP

(57) ABSTRACT

A SAW device includes a piezoelectric substrate and a package body holding the piezoelectric substrate, wherein the package body includes a bottom part carrying the piezoelectric substrate in a face-down state and a side wall part laterally surrounding the piezoelectric substrate, the bottom part carrying a wiring pattern for electrical connection with an electrode pattern on the piezoelectric substrate, the wiring pattern including a first ground pattern and a second ground pattern in a mutually separated relationship, the first ground pattern and the second ground pattern being connected electrically with each other.

12 Claims, 15 Drawing Sheets

80

SURFACE-ACOUSTIC-WAVE DEVICE FOR FLIP-CHIP MOUNTING

CROSS-REFERENCE TO RELATED APPLICATION

The present application is based on Japanese priority application No. 11-227429 filed on Aug. 11, 1999, the entire contents of which are hereby incorporated by reference.

BACKGROUND OF THE INVENTION

The present invention generally relates to surface-acoustic-wave devices and more particularly to a surface-acoustic-wave device for flip-chip mounting.

Surface-acoustic-wave devices hereinafter designated as SAW devices are used extensively in various electronic apparatuses having a high-frequency circuit, including portable telephone sets, wireless telephone sets, and various radio sets. By using a surface-acoustic-wave device, it becomes possible to reduce the weight and size of these electronic apparatuses.

On the other hand, the demand for size and weight reduction is still continuing in electronic apparatuses and hence in the SAW devices used therein. In the case of SAW devices, the size reduction has to be achieved so as to avoid deterioration of attenuation characteristic outside the pass-band.

FIG.1 shows an equivalent circuit diagram of a SAW filter of a related art having a ladder-type construction, while FIG.2 shows the actual construction of the SAW filter of FIG.1 in a cross-sectional view.

Referring to FIG.1, the ladder-type SAW filter includes resonators 13 and 14 connected in series and interposed between an input terminal 11 and an output terminal 12, and there are provided parallel resonators 15, 16 and 17 respectively shunting a signal path between the input terminal 11 and the SAW filter 13, a signal path between the SAW filters 13 and 14, and a signal path between the SAW filter 14 and the output terminal 12, to the ground. These resonators 13–17 are formed on a common piezoelectric substrate 10 of a $LiTaO_3$ or $LiNbO_3$ single crystal.

FIG.2 shows the piezoelectric substrate 10 in the state that the piezoelectric substrate 10 is mounted on a filter package 20.

Referring to FIG.2, the filter package 20 includes a bottom part 21A covered by a conductor film 21a and a side wall part 21B, wherein the bottom part 21A and the side wall part 21B form together a depression 21C. Thus, the piezoelectric substrate 10 is accommodated in the depression 21C in such a manner that the piezoelectric substrate 10 is mounted on the conductor film 21a covering the bottom part 21A in a face-up state by way of an adhesive layer 21b. Thus, an electrode pattern corresponding to the equivalent circuit diagram of FIG.1 is formed on the top principal surface of the piezoelectric substrate 10. Further, wiring patterns 21c and 21d are formed on the top surface of the side wall part 21B, and the electrode pattern on the substrate 10 is connected to the wiring patterns 21c and 21d via respective bonding wires 22A and 22B.

It should be noted that the SAW device 20 of FIG.2 further includes a frame part 21D on the top surface of the side wall part 21B so as to expose the wiring patterns 21c and 21d, and a metal cap 23 is provided on the frame part 21D. The metal cap 23 is connected to the ground pads 21e and 21f provided on the bottom surface of the bottom part 21A via respective ground patterns 22e and 22f formed on the frame part 21D. Further, the wiring patterns 21c and 21d on the side wall part 21B are connected also electrically to corresponding electrodes that are provided on the bottom surface of the bottom part 21A.

In the filter package 20 of FIG.2, the bonding wires 22A and 22B are used for electrical connection between the SAW device on the piezoelectric substrate 10 and the wiring patterns 21c and 21d. In order to accommodate such bonding wires, the SAW device of FIG.2 has used the frame part 21D, while such a construction inevitably increases the height of the SAW package 20 and thus contradicts with the requirement of size reduction of SAW devices.

SUMMARY OF THE INVENTION

Accordingly, it is a general object of the present invention to provide a novel and useful SAW device wherein the foregoing problems are eliminated.

Another and more specific object of the present invention is to provide a SAW filter device having a compact size and simultaneously an excellent spurious suppression performance outside a pass-band.

Another object of the present invention is to provide a surface-acoustic-wave device, comprising:

a piezoelectric substrate;

an electrode pattern provided on a principal surface of said piezoelectric substrate, said electrode pattern forming a ladder-type surface-acoustic-wave filter; and a package body accommodating therein said piezoelectric substrate, said package body comprising: a bottom part carrying said piezoelectric substrate in a face-down state; and a side wall part laterally surrounding said piezoelectric substrate on said bottom part, said bottom part and said side wall part forming together a depression accommodating therein said piezoelectric substrate, said bottom part carrying a wiring pattern for electrical connection with said electrode pattern, said wiring pattern including a first ground pattern and a second ground pattern in a mutually separated relationship on said bottom part, said first ground pattern and said second ground pattern being connected electrically with each other.

Another object of the present invention is to provide a surface-acoustic-wave device, comprising:

a package body having a mounting surface;

a piezoelectric substrate mounted on said mounting surface in a face-down state;

a first electrode pattern provided on a principal surface of said piezoelectric substrate facing said mounting surface in said face-down state of said piezoelectric substrate, said first electrode pattern forming a ladder-type filter; and a second electrode pattern provided on said principal surface of said piezoelectric substrate, said second electrode pattern forming a double-mode-type filter;

each of said first and second electrode patterns including a plurality of ground electrodes formed on said principal surface, said mounting surface carrying a first ground pattern making a contact commonly with said plurality of ground electrodes of said first electrode pattern, said mounting surface further carrying a plurality of mutually separated second ground patterns each making an electrical contact with a corresponding one of said plurality of ground electrodes of said second electrode pattern.

According to the present invention, the space needed in the SAW device of the related art at the top part of the package body for accommodating the bonding wires is eliminated, and the size of the SAW device is reduced successfully. By forming the first ground pattern on the package body as a part of the electrode pattern of the ladder-type filter in such a manner that the first ground pattern makes a contact with the ground electrode of an input/output shunting resonator, and by forming the second ground pattern on the package body so as to make a contact with the ground electrode of the intermediate shunting resonator shunting an intermediate signal path of the ladder-type SAW filter, and further by connecting the first ground pattern and the second ground pattern electrically, suppression of spurious components outside a pass-band of the SAW filter is improved substantially. The degree of suppression of the spurious components is improved further by interposing an inductance between the first and second ground patterns and by optimizing the value of the inductance.

By forming the ground electrodes in the form of stacking of a plurality of bumps, or by forming the wiring patterns on the mounting surface in the form of stacking of a plurality of conductor patterns, the problem of short circuit caused between the electrode pattern on the piezoelectric substrate and the ground pattern on the mounting surface is successfully eliminated.

The present invention is applicable also to a SAW device in which a plurality of electrode patterns including the ladder-type electrode pattern is formed on the principal surface of the piezoelectric substrate. The SAW device includes the one in which an electrode pattern corresponding to a double-mode-type filter is provided on the principal surface of the piezoelectric substrate in addition to the ladder-type electrode pattern.

Other objects and further features of the present invention will become apparent from the following detailed description when read in conjunction with the attached drawings.

DETAILED DESCRIPTION OF THE INVENTION

FIRST EMBODIMENT

Figure 3:
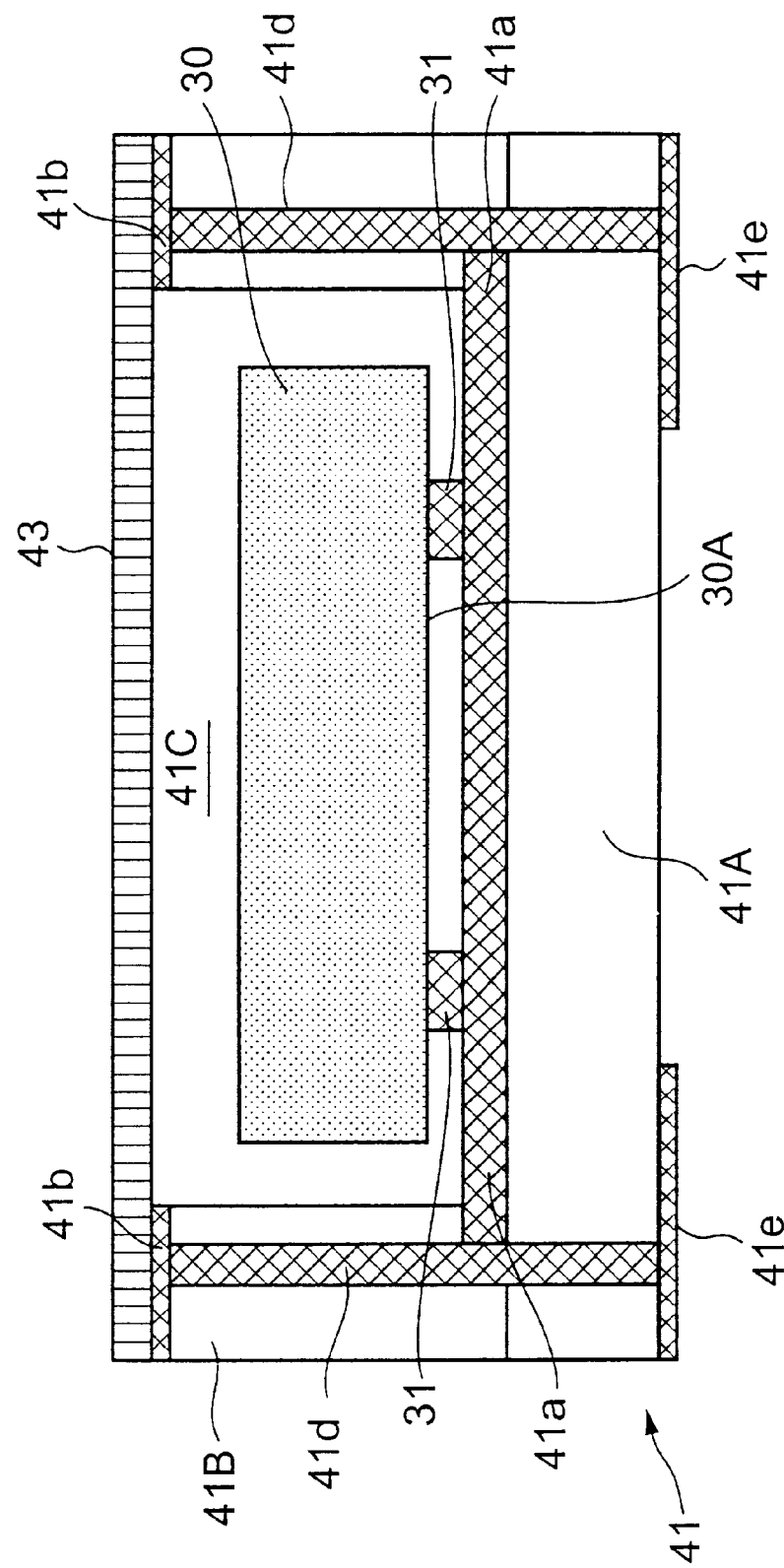
FIG. 3 is a cross-sectional diagram showing the construction of a SAW device according to a first embodiment of the present invention.

FIG. 3 shows the construction of a SAW device 40 according to a first embodiment of the present invention.

Referring to FIG. 3, the SAW device 40 includes a filter package body 41 and a piezoelectric substrate 30 mounted on the filter package 41. The piezoelectric substrate 30 carries an electrode pattern of a ladder-type SAW filter corresponding to the equivalent circuit diagram of FIG. 1 on a bottom principal surface 30A thereof, and the piezoelectric substrate 30 is mounted on the filter package body 41 in a face-down state.

On the other hand, the filter package body 41 includes a bottom part 41A carrying a wiring pattern 41a and further a side wall part 41B formed on the bottom part 41A, wherein the wiring pattern 41a includes a ground pattern and the bottom part 41A and the side wall part 41B form together a depression 41C in the package body 41 such that the depression 41C accommodates therein the piezoelectric substrate 30. Thereby, the piezoelectric substrate 30 is flip-chip mounted on the wiring pattern 41a on the bottom part 41A by way of bump electrodes 31.

Figure 1:
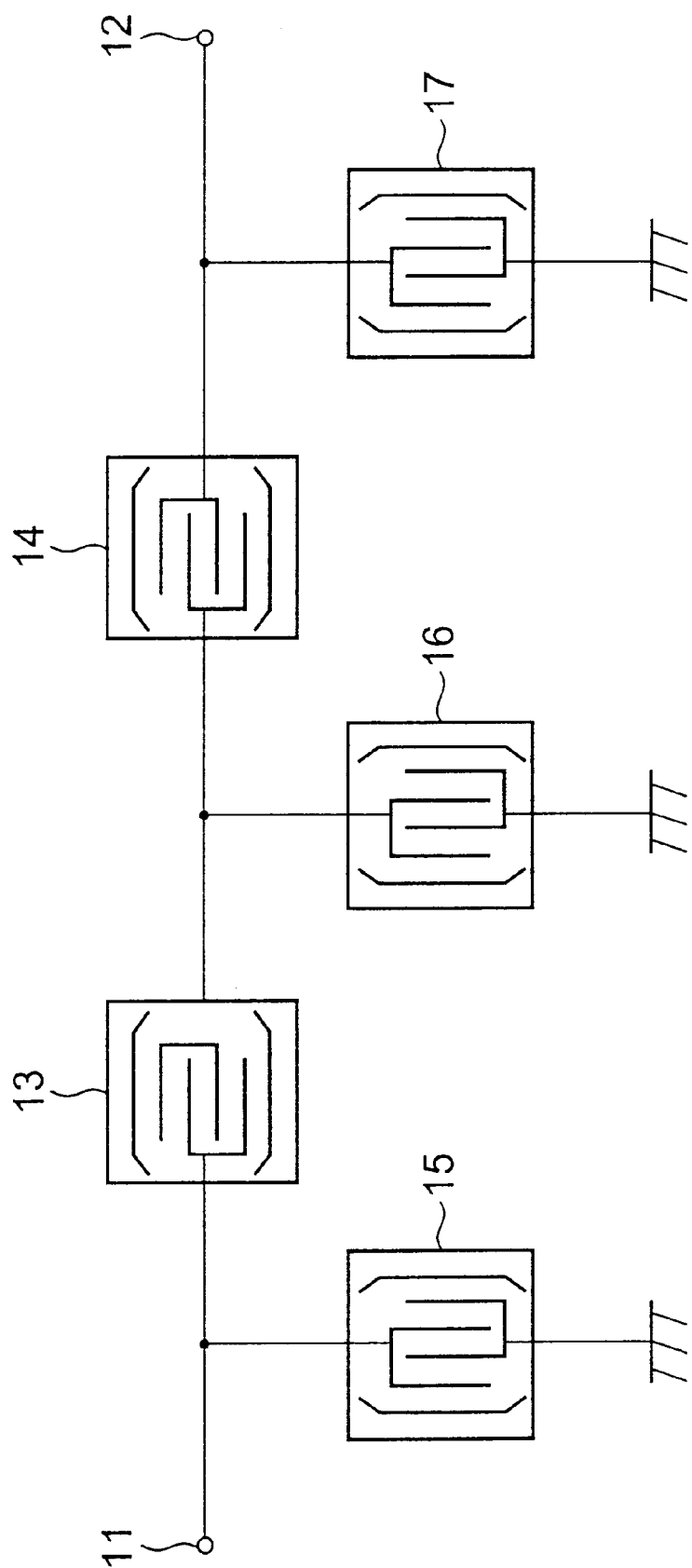
FIG. 1 is an equivalent circuit diagram of a typical ladder-type SAW device.
Figure 4:
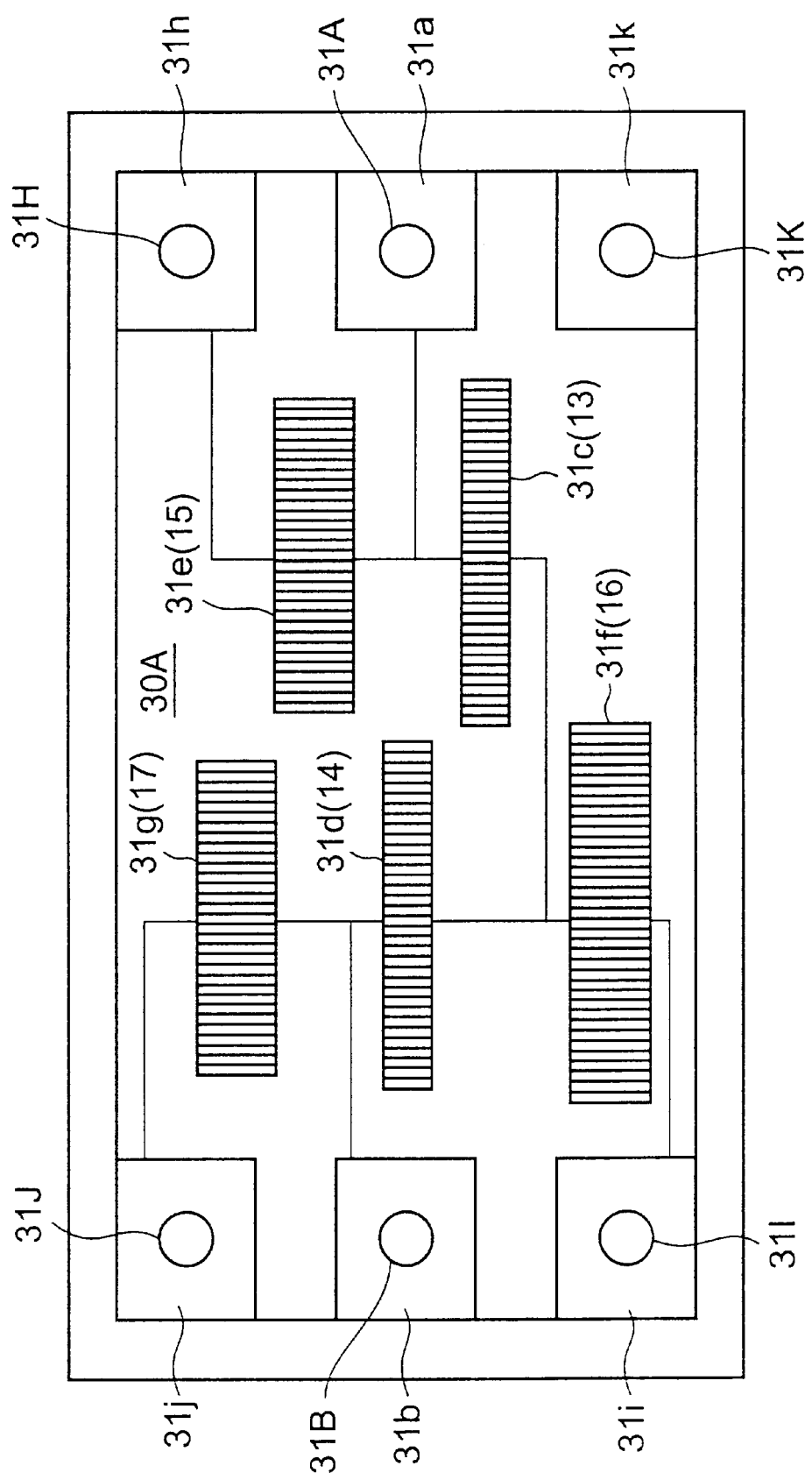
FIG. 4 is a plan view showing an electrode pattern of a ladder-type SAW filter formed on a piezoelectric substrate in the SAW device of FIG. 3.

FIG. 4 shows an example of the electrode pattern formed on the bottom surface 30A of the piezoelectric substrate 30 in correspondence to the ladder-type SAW filter represented in the equivalent circuit diagram of FIG. 1. In FIG. 4, those parts corresponding to the parts described previously are designated by the same reference numerals and the description thereof will be omitted.

Referring to FIG. 4, the electrode pattern includes an input electrode pad 31a and an output electrode pad 31b respectively corresponding to the input terminal 11 and the output terminal 12, and there are provided interdigital electrode patterns 31c and 31d respectively corresponding to the SAW resonators 13 and 14 connected in series between the input electrode pad 31a and the output electrode pad 31b. Further, the electrode pattern includes, in addition to the electrode patterns 31c and 31d, a parallel interdigital electrode pattern 31e shunting the signal path between the input electrode pad 31a and the interdigital electrode pattern 31c in correspondence to the SAW resonator 15, a parallel interdigital electrode pattern 31f shunting the signal path between the interdigital electrode patterns 31c and 31d, and a parallel interdigital electrode pattern 31g shunting the signal path between the interdigital electrode pattern 31d and the output electrode pad 31b. Further, the foregoing principal surface 31A carries thereon a ground pad 31h connected to the interdigital electrode 31e, a ground pad 31i connected to the interdigital electrode 31f, a ground pad 31j connected to the interdigital electrode pattern 31g, and a dummy electrode pad 31k. The ground pads 31h–31j carries thereon ground bump electrodes 31H–31J, respectively. Similarly, another dummy bump electrode 31K is provided on the dummy electrode pad 31k.

Figure 5:
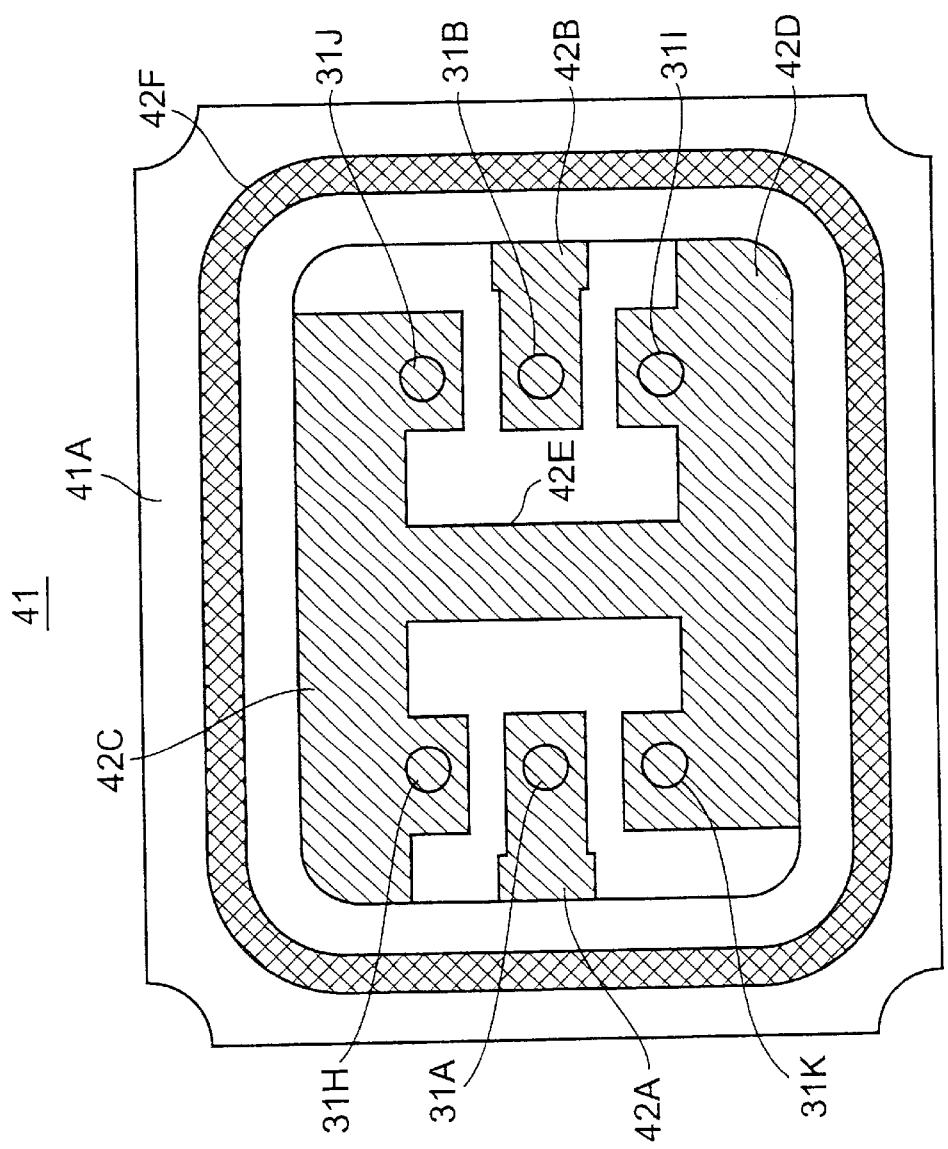
FIG. 5 is a plan view showing a wiring pattern formed on a package body of the SAW device of FIG. 3.

FIG. 5 shows an example of the wiring pattern 41a provided on the bottom part 41A of the package body 41 in correspondence to the electrode pattern of FIG. 4.

Referring to FIG. 5, the wiring pattern 41a includes an input pad 42A contacting the input bump electrode 31A when the piezoelectric substrate 30 is flip-chip mounted, an output pad 42B contacting the output bump electrode 31B when the piezoelectric substrate 30 is flip-chip mounted, a ground pad 42C contacting the ground bump electrodes 31H and 31j when the piezoelectric substrate 30 is flip-chip mounted, and a ground pad 42D contacting the ground bump electrode 31I and the dummy bump electrode 31K when the piezoelectric substrate 30 is flip-chip mounted, wherein the ground pad 42C and the ground pad 42D are connected with each other by a conductive pattern 42E. Further, a seal ring 42F of a conductive pattern is provided on the bottom part 41A so as to surround the pads 42A–42E continuously. Further, the input pad 42A and the output pad 42B are formed on the bottom part 41A in the region between the ground pads 42C and 42D.

Referring back to FIG. 3 again, the side wall part 41B surround the piezoelectric substrate 30 flip-chip mounted on the bottom part 41A. Thus, the bottom part 41A and the side wall part 41B form together a depression 41C accommodating the piezoelectric substrate 30 in the package body 41. Further, a conductive seal ring 41b is formed on the top surface of the side wall part 41B such that the seal ring 41b is connected electrically to the ground pad 41e on the bottom surface of the bottom part 41A via a ground pattern 41d extending through the side wall part 41B.

Further, a conductive cap 43 typically of a metal is formed on the side wall part 41B, and the cap 43 is connected electrically to the ground pad 41e on the bottom surface of the bottom part 41A via the conductive seal ring 41b on the top surface of the side wall part 41B.

Figure 2:
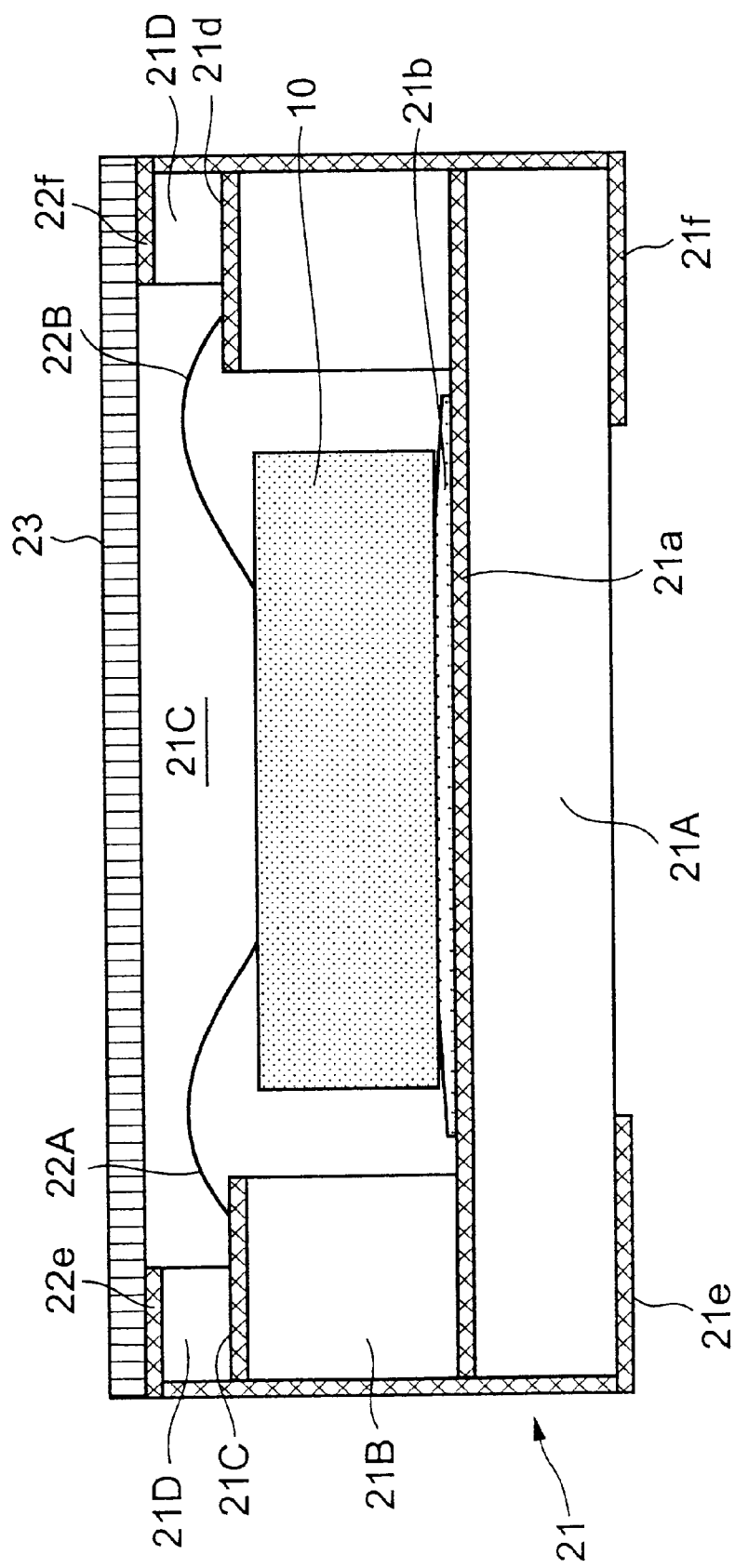
FIG. 2 is a cross-sectional diagram showing the construction of the ladder-type SAW device of FIG. 1.

As can be seen from FIG. 3, the SAW device 40 of the present embodiment eliminates the space, which has been necessary for accommodating the bonding wires in the SAW device 20 of FIG. 2, by flip-chip mounting the piezoelectric substrate 30 on the bottom part 41A of the package body 41. As a result, the overall height of the SAW device 20 is reduced.

Figure 6:
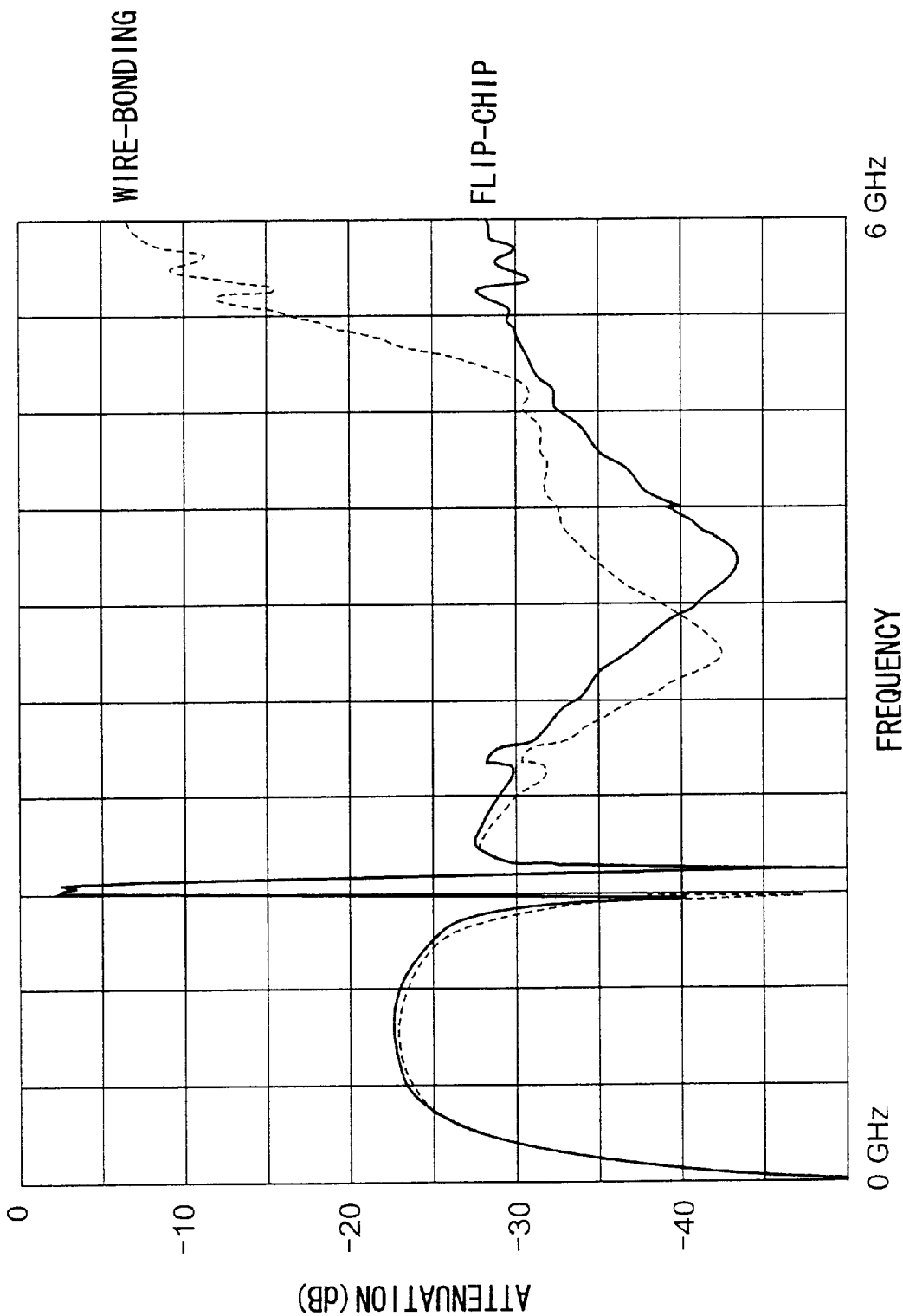
FIG. 6 is a diagram showing the frequency characteristic of the SAW device of FIG. 3 in comparison with the SAW device of FIG. 2.

FIG. 6 shows the frequency characteristic of the SAW device 40 of FIG. 3 in comparison with the frequency characteristic of the SAW device 20 of FIG. 2. In FIG. 6, the frequency characteristic was measured in both cases in the state that the piezoelectric substrate is mounted on the package body and the package body is sealed by the cap. In the drawing, the frequency characteristic of the SAW device 40 of FIG. 3 is represented by a continuous line, while the frequency characteristic of the SAW device 20 of FIG. 2 is represented by a broken line.

Referring to FIG. 6, it can be seen that the SAW device 20, which uses the bonding wires, shows a slightly better off-band spurious suppression (spurious suppression outside the pass-band) in the frequency range close to the pass-band, while the SAW device 40 of FIG. 3 shows a much better off-band spurious suppression in the frequency range exceeding about 3.6 GHz. In view of the fact that there tends to occur a problem of noise emission caused in a portable telephone set or radio set that uses a plural number of SAW devices due to the interference between the SAW devices, and in view of the fact that such a noise emission is predominant in the very high frequency range higher than about 3.6 GHz, the SAW device 40 of the present embodiment is quite effective for suppressing the noise.

Figure 7:
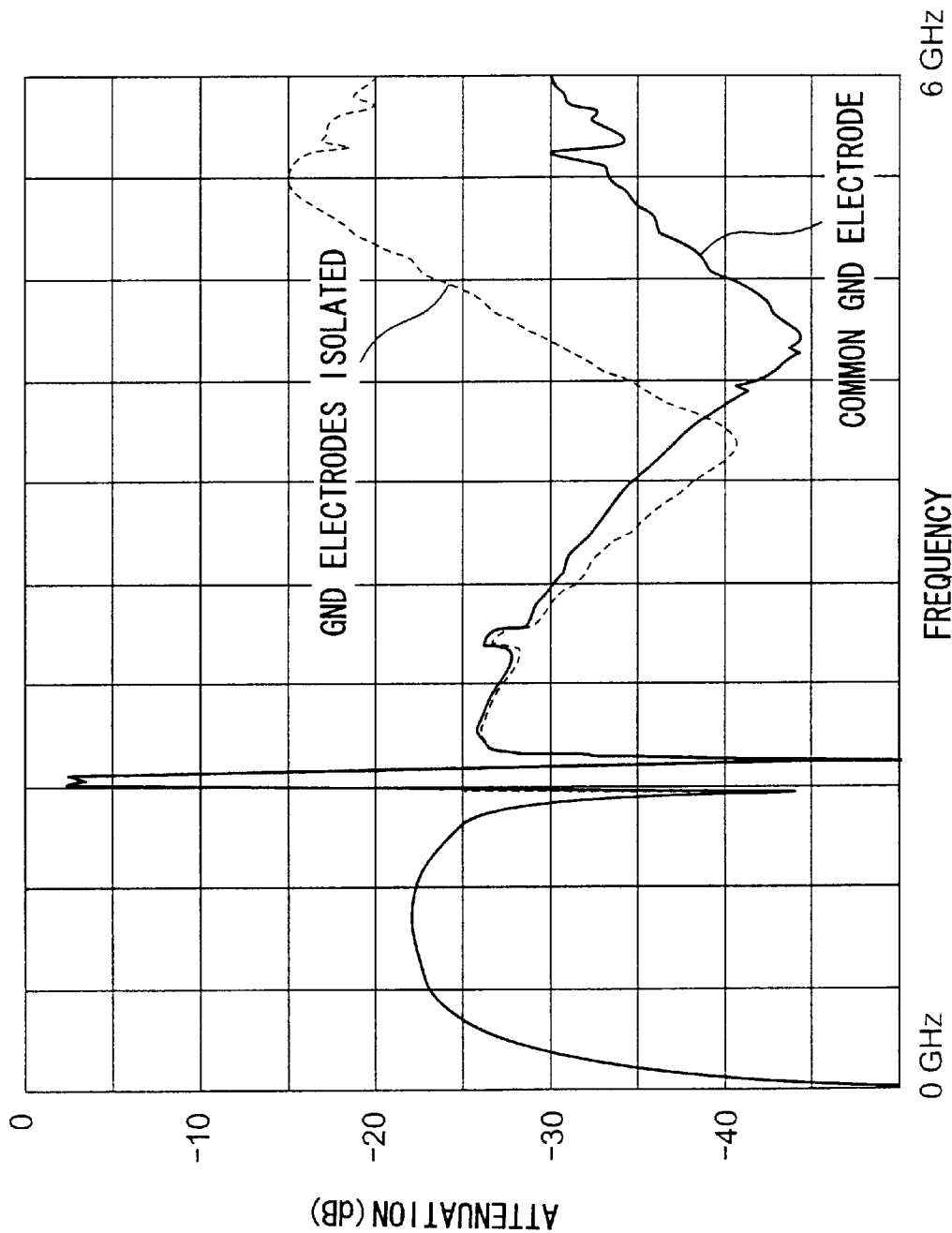
FIG. 7 is a diagram showing the frequency characteristic of the SAW device of FIG. 3 in comparison with another SAW device.

FIG. 7 shows the frequency characteristic of the SAW device 40 of FIG. 3 in comparison with the case in which the conductor pattern 42E connecting the ground patterns 42C and 42D is eliminated. In FIG. 7, the continuous line represents the case in which the ground patterns 42C and 42D are electrically connected with each other, while the broken line represents the case in which the ground patterns 42C and 42D are isolated.

Referring to FIG. 7, it can be seen that a slightly better off-band spurious suppression is obtained in the frequency range close to the pass-band frequency when the ground patterns 42C and 42D are isolated. In the frequency region exceeding about 3.6 GHz, on the other hand, it can be seen from FIG. 7 that the SAW device 40 of FIG. 3 provides a much better off-band suppression as compares with the SAW device 20 of FIG. 2.

In view of the fact that there tends to occur a problem of noise emission caused in a portable telephone set or radio set that uses a plural number of SAW devices as a result of interference of the SAW devices, and in view of the fact that such a noise emission is predominant in the very high frequency range higher than about 3.6 GHz, the SAW device 40 of the present embodiment is quite effective for suppressing the noise.

SECOND EMBODIMENT

Figure 8:
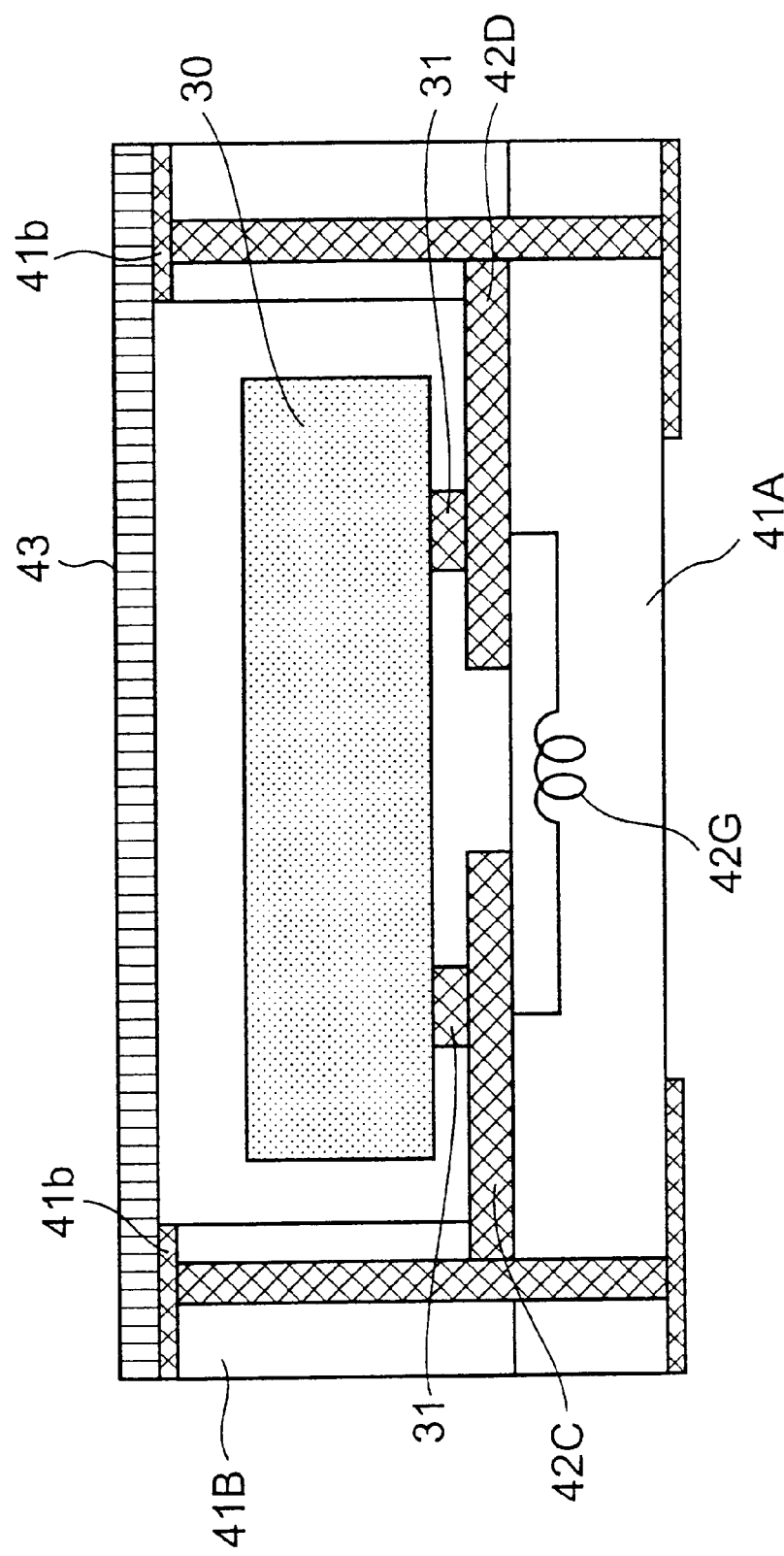
FIG. 8 is a cross-sectional diagram showing the construction of a SAW device according to a second embodiment of the present invention.

FIG. 8 shows the construction of a SAW device 50 according to a second embodiment of the present invention, wherein those parts corresponding to the parts described previously are designated by the same reference numerals and the description thereof will be omitted.

Referring to FIG. 8, the SAW device 50 of the present embodiment has a construction similar to that of the SAW device 40 except that the conductor pattern 42E connecting the ground patterns 42C and 42D on the bottom part 41A of the package body 41 is replaced with an inductance line.

Figure 9:
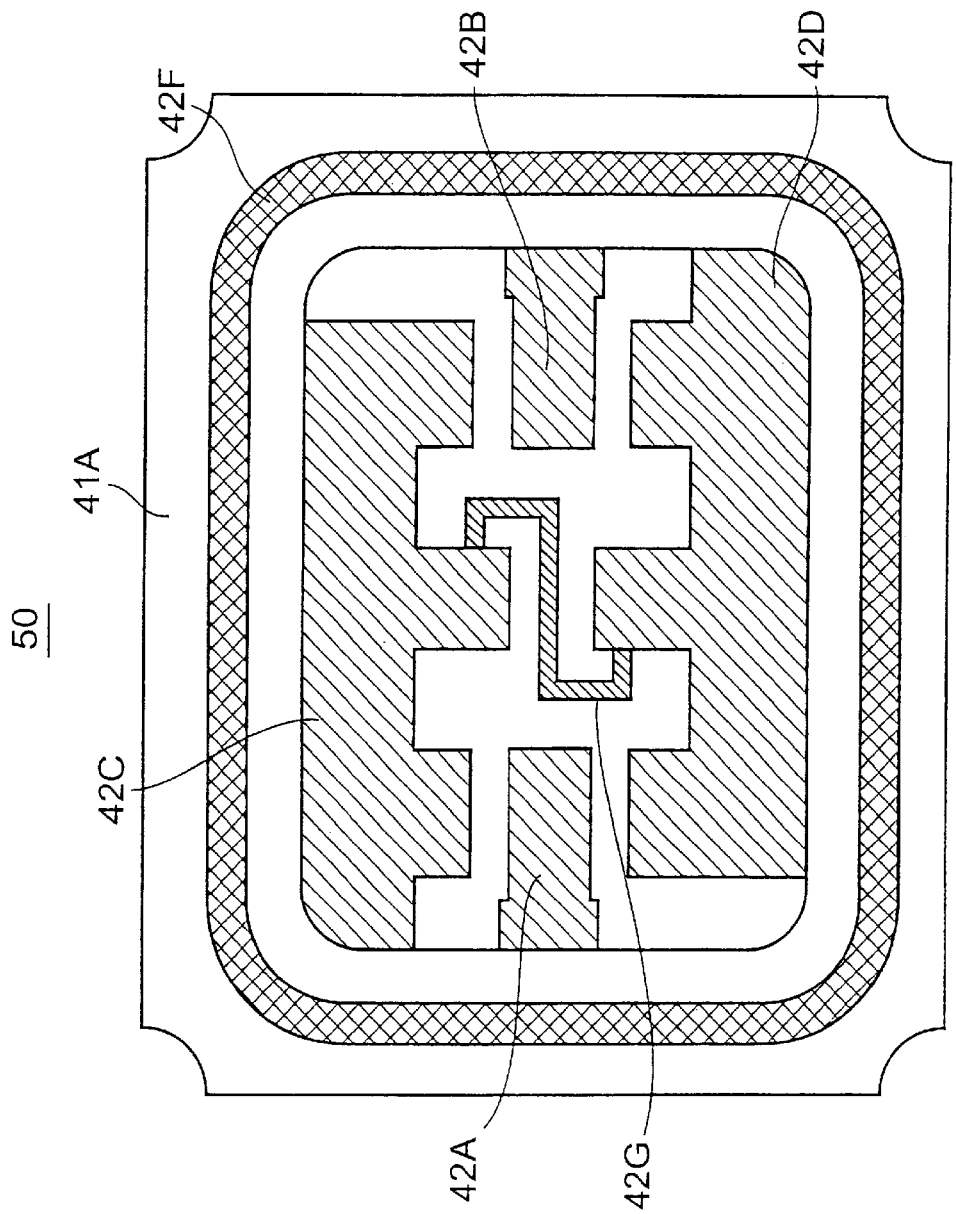
FIG. 9 is a plan view showing a wiring pattern formed on a package body of the SAW device of FIG. 8.

FIG. 9 shows the SAW device 50 of FIG. 8 in plan view.

Referring to FIG. 9, the inductance line 42G is formed of a zigzag conductor pattern extending on the bottom part 41A, and the ground pattern 42C and the ground pattern 42D are connected with each other via the inductance formed by the zigzag conductor pattern.

Figure 10:
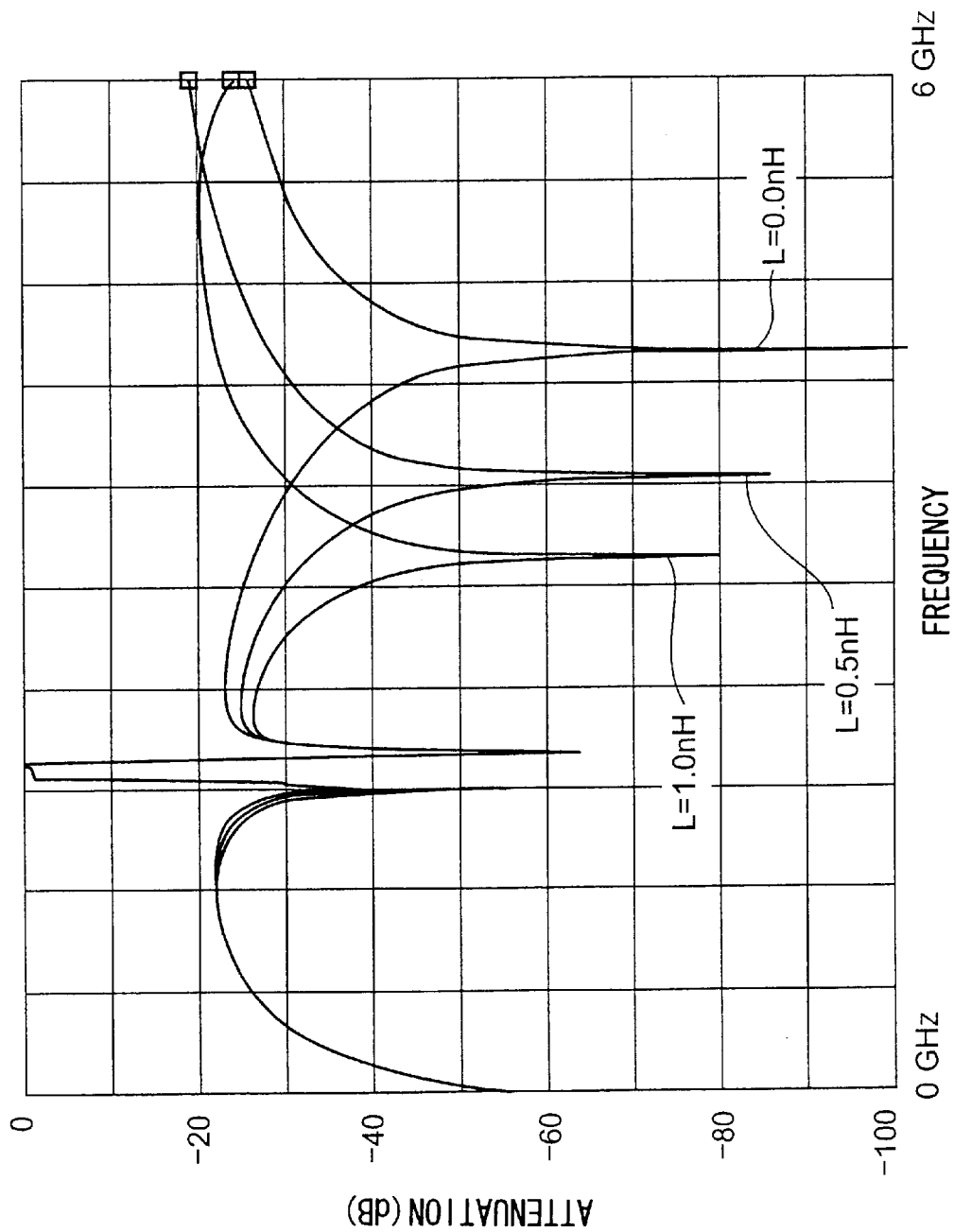
FIG. 10 is a diagram showing the frequency characteristic of the SAW filter of FIG. 8.

FIG. 10 shows the frequency characteristic of the SAW device 50 for the case the inductance of the line 42 is changed variously.

Referring to FIG. 10, it can be seen that the off-band spurious suppression of the SAW device 50 changes variously depending on the value of inductance of the line 42G and that the off-band spurious suppression is improved in the frequency range close to the pass-band frequency of the SAW device 50 with increasing value of the inductance. In the case the inductance of the line 42G is set to zero, on the other hand, the off-band spurious suppression is improved in the frequency range exceeding about 4 GHz.

Thus, it is possible to optimize the off-band spurious suppression in the SAW device 50 of the present embodiment, by optimizing the value of the inductance of the line 42G according to the need.

THIRD EMBODIMENT

Figure 11:
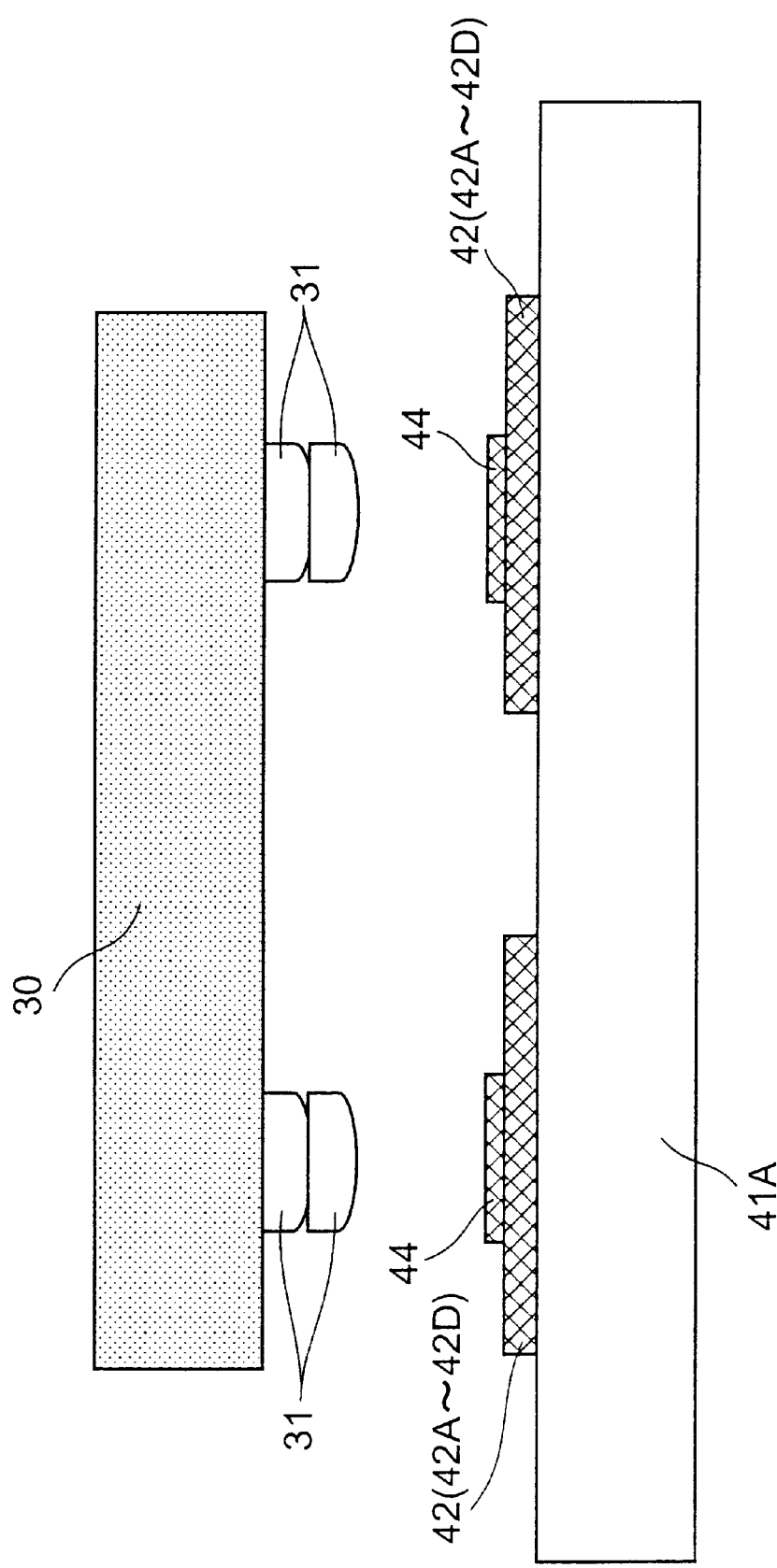
FIG. 11 is a cross-sectional diagram showing the construction of a SAW device according to a third embodiment of the present invention.

FIG. 11 shows the construction of the SAW filter 60 according to a third embodiment of the present invention, wherein those parts corresponding to the parts described previously are designated by the same reference numerals and the description thereof will be omitted.

Referring to FIG. 11, the SAW device 60 of the present embodiment has a construction similar to that of the SAW device 40 of FIG. 3, except that another conductive pad 44 is formed on a contact pad 42 formed on the bottom surface of the package body 41. It should be noted that the contact pad 42 includes the contact pads 42A–42D described previously with reference to FIG. 5 and that the conductive pad 44 is formed in correspondence to the region in which the bump electrodes 31A, 31B and 31H–31K on the piezoelectric substrate 30 make a contact (designated in FIG. 11 collectively by a reference numeral 31). See also FIG. 4. In the illustrated example, the bump electrode 31 has a construction in which two bump electrodes are stacked.

For example, the pads 42 and the conductive pads 44 may be formed by a conductive layer in which a Ni layer is sandwiched by a pair of Au layers. Alternatively, the pads 42 and the conductive pads 44 may be formed by a Cu layer. Further, each of the bump electrodes 31 may be formed of Au.

In the SAW device 60 of FIG. 11, the separation between the principal surface 30A of the substrate 30 and the bottom surface 41A of the package body 41 is increased as a result of the formation of the conductive pad 44 on the pad 42 or as a result of the multiple layer construction of the bump electrode 31. Thereby, the risk of short circuit between the conductor pattern on the substrate 30 and the wiring pattern on the bottom surface 41A is reduced.

FOURTH EMBODIMENT

Figure 12:
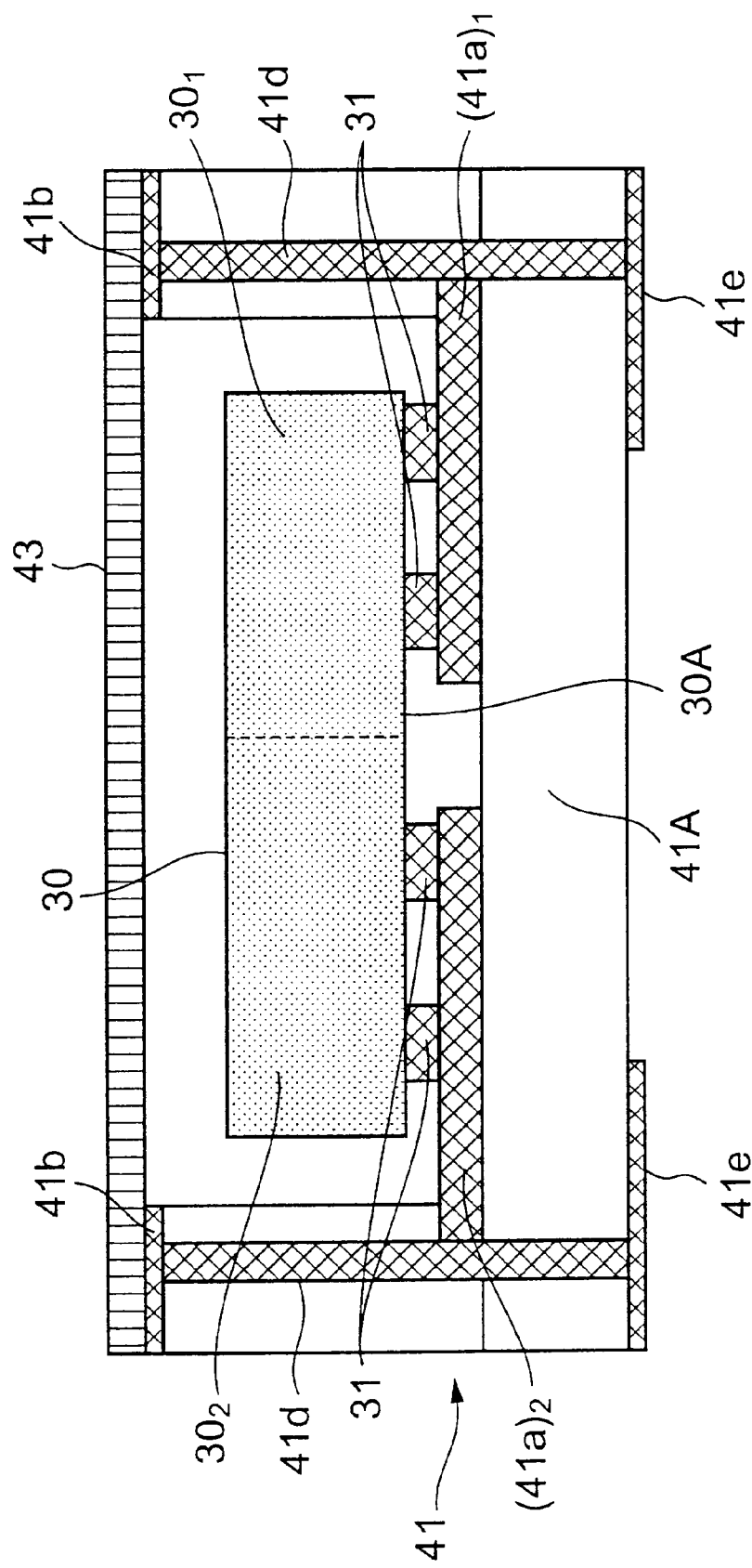
FIG. 12 is a cross-sectional diagram showing the construction of a SAW device according to a fourth embodiment of the present invention.

FIG. 12 shows the construction of the SAW device 70 according to a fourth embodiment of the present invention, wherein those parts corresponding to the parts described previously are designated by the same reference numerals and the description thereof will be omitted.

Referring to FIG. 12, the bottom principal surface 30A of the piezoelectric substrate 30 is now divided into a region $30_1$ and a region $30_2$, and the electrode pattern of the ladder-type filter described previously with reference to FIG. 4 is formed on each of the foregoing regions. Further, a wiring pattern $(41a)_1$ corresponding to the region $30_1$ and a wiring pattern $(41a)_2$ corresponding to the region $30_2$ are formed on the bottom surface 41A of the package body 41 with a mutually isolation. The ladder-type filter formed in the region $30_1$ and the ladder-type filter formed in the region $30_2$ may have respective, mutually different off-band spurious suppression characteristics.

It should be noted that each of the wiring patterns $(41a)_1$ and $(41a)_2$ includes the contact pads 42A–42D explained with reference to FIG. 5 and the contact pads 42C and 42D are connected with each other electrically.

Thus, according to construction of the SAW filter 70 of the present embodiment, it is possible to form a plurality of filter elements having respective, different pass-band characteristics in a common package body. Thereby, by connecting the ground electrodes commonly in each of the regions $30_1$ and $30_2$, it is possible to improve the off-band spurious suppression substantially in the very high frequency range much higher than the pass-band frequency. By separating the ground electrode in each of the regions $30_1$ and $30_2$, it is possible to improve the isolation between the filter elements.

FIFTH EMBODIMENT

Figure 13:
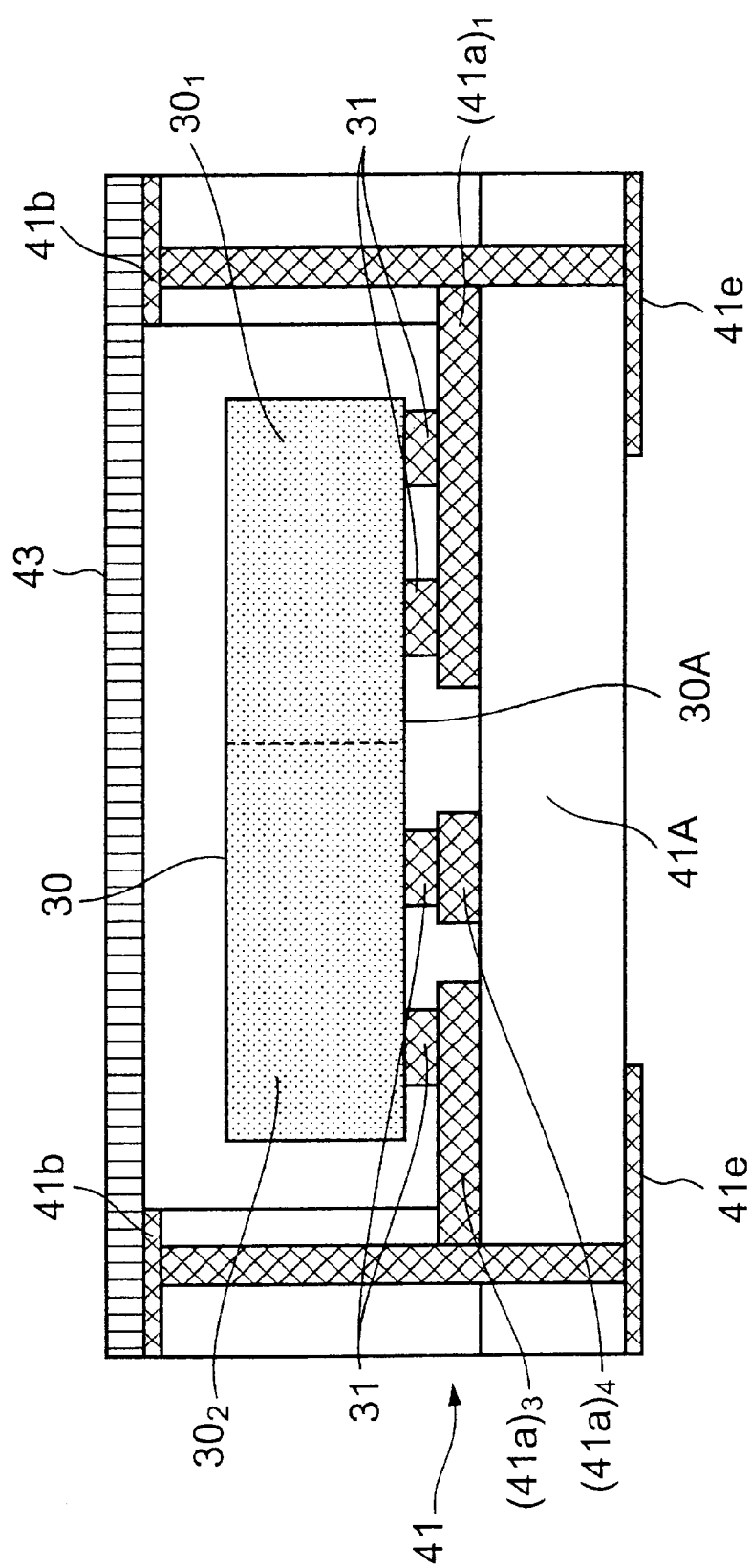
FIG. 13 is a cross-sectional diagram showing the construction of a SAW device according to a fifth embodiment of the present invention.

FIG. 13 shows the construction of a SAW device 80 according to a fifth embodiment of the present invention, wherein those parts corresponding to the parts described previously are designated by the same reference numerals and the description thereof will be omitted.

Referring to FIG. 13, the bottom principal surface 30A of the piezoelectric substrate 30 is divided into the regions $30_1$ and $30_2$ similarly to the SAW device 70 of FIG. 12, and the region $30_1$ is formed with the ladder-type electrode pattern explained with reference to FIG. 4 similarly to the previous embodiment. In the present embodiment, on the other hand, an electrode pattern corresponding to a double-mode-type filter shown in FIG. 14 is formed on the region $30_2$.

Figure 14:
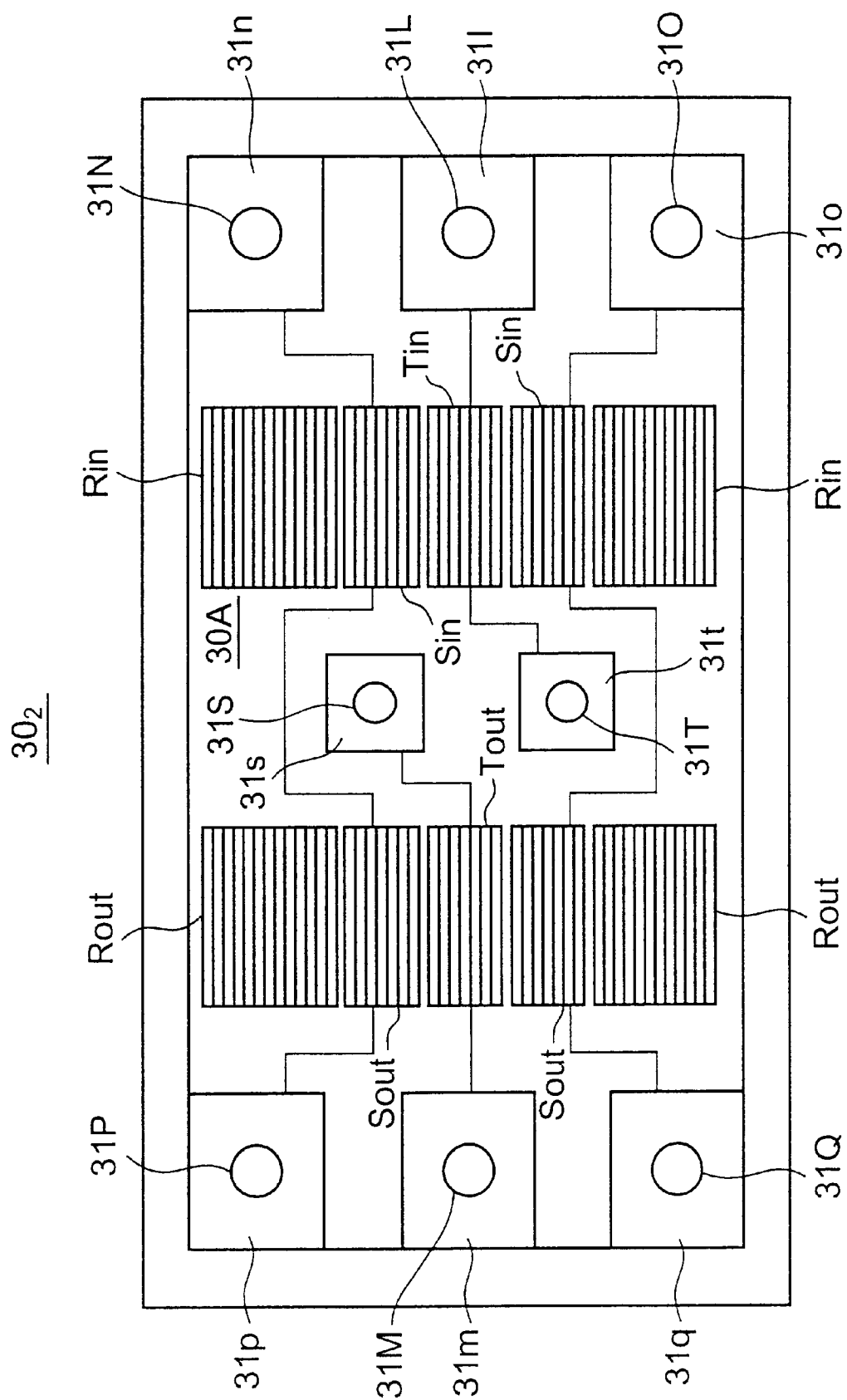
FIG. 14 is a plan view showing an electrode pattern of a double-mode-type SAW filter formed on a piezoelectric substrate in the SAW device of FIG. 13.

Referring to FIG. 14, an input electrode pad 31$l$ and an output electrode pad 31$m$ are formed on the region $30_2$ and an input interdigital electrode pair Tin is formed in electrical connection with the input electrode pad 31$l$. Further, a pair of further input interdigital electrode pairs Sin are formed at both lateral sides of the interdigital electrode pair Tin on the propagation path of the surface acoustic wave excited by the interdigital electrode pair Tin. Further, a pair of reflectors Rin are disposed at further outer sides thereof.

On the region $30_2$, there is further provided an output-side interdigital electrode pair Tout in electrical connection with the output electrode pad 31$m$, and a pair of further output interdigital electrode pairs Sout are provided on the propagation path of the surface acoustic wave at both lateral sides of the interdigital electrode pair Tout. The output interdigital electrode pairs Sout are driven by an output electric signal of the interdigital electrode pairs Sin, and the surface acoustic wave thus excited by the interdigital electrode pairs Sout drives the interdigital electrode pair Tout formed there between. The output of the interdigital electrode pair Tout is then supplied to the output electrode pad 31$m$.

In the double-mode-type filter of the foregoing construction, a ground electrode 31$t$ is formed on the region 31$e$ in correspondence to the interdigital electrode pair Tin and a ground electrode 31$n$ or 31$o$ is formed in correspondence to the interdigital electrode pair Sin. Further, a ground electrode 31$s$ is formed in correspondence to the interdigital electrode pair Tout and a ground electrode 31$p$ or 31$q$ is formed in correspondence to the interdigital electrode pair Sout. Further, bump electrodes 31L–31Q, 31S and 31T are formed on the corresponding electrodes 31$l$–31$q$, 31$s$ and 31$t$, respectively.

Figure 15:
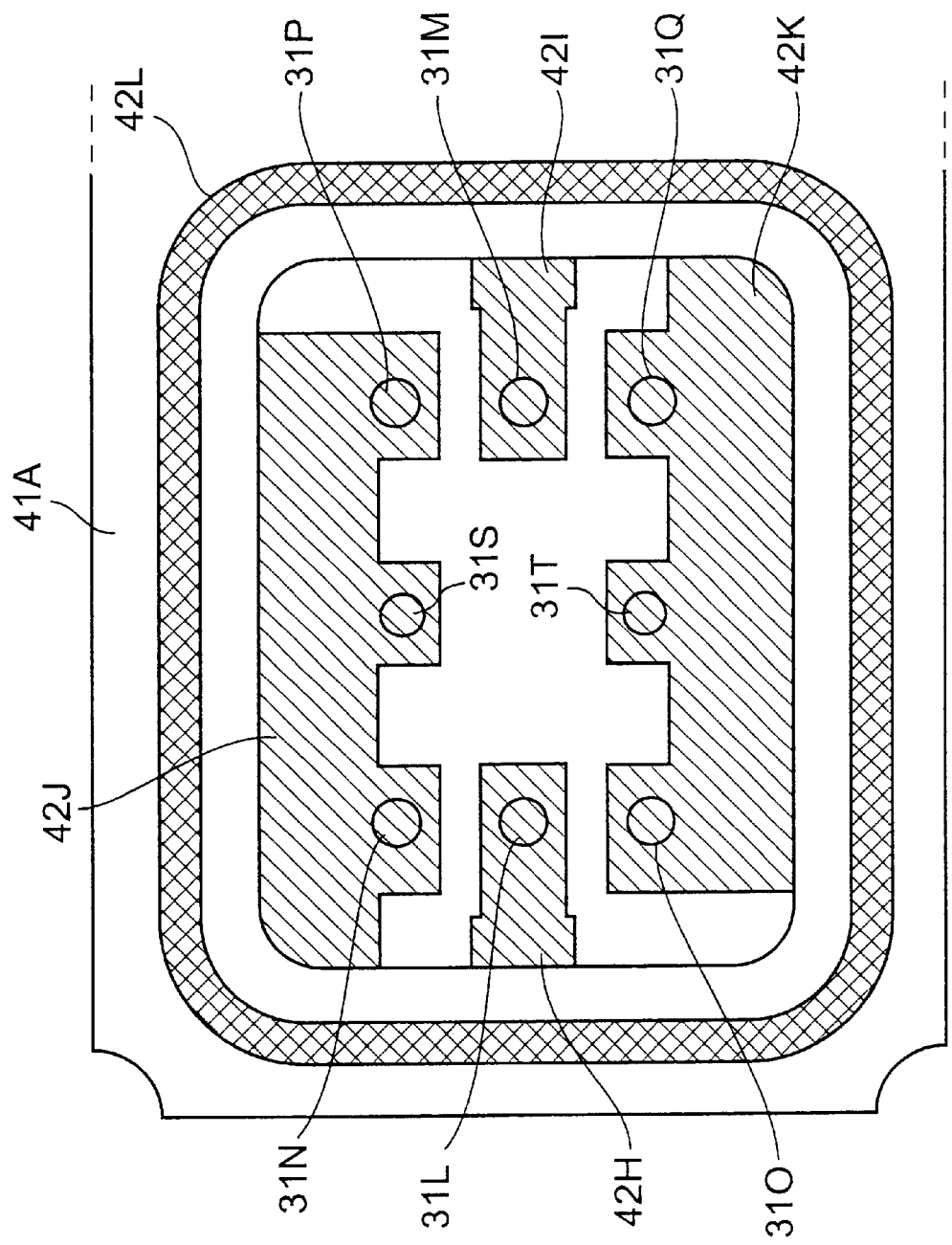
FIG. 15 is a plan view showing a wiring pattern formed on a package body in correspondence to the electrode pattern of FIG. 14 in the SAW device of FIG. 13.

FIG. 15 shows the wiring pattern formed on the bottom part 41A of the package body 41 in correspondence to the electrode pattern of the double-mode-type filter of FIG. 14 formed on the piezoelectric substrate.

Referring to FIG. 15, it can be seen that the part of the bottom part 41A corresponding to the region $30_2$ of the piezoelectric substrate 30 carries an input pad 42H for contact with the input bump electrode 31L, an output pad 31I for contact with the output bump electrode 31M, a first ground pad 42J for contact with the ground bump electrodes 31N, 31P and 31S, and a second ground pad 42K for contact with the ground bump electrodes 31O, 31Q and 31T, and the pads 42H–42K are surrounded by a seal ring 42L similar to the seal ring 42F explained previously.

In the wiring pattern for such a double-mode-type filter, it should be noted that the first ground pad 42J and the second ground pad 42K are formed in a mutually isolated state, and no pattern is formed on the bottom part 41A for electrical connection between the ground pads 42J and 42K. In correspondence to this, mutually isolated wiring patterns $(41a)_3$ and $(41a)_4$ are formed in the part of the bottom part 41A corresponding to the region $30_2$ in place of the wiring pattern $(41a)_2$ of FIG. 12.

Other aspects of the SAW device 30 of the present embodiment are similar to those described previously and description thereof will be omitted. In the SAW device 80, too, it should be noted that the wiring pattern formed on the bottom part 41A of the package body 41 is electrically separated into a part corresponding to the ladder-type filter and a part corresponding to the double-mode-type filter. Further, the interaction between these two parts are positively eliminated by shielding the respective parts by the seal rings 42F and 42L.

In the SAW device 80 of the present embodiment, it is possible to form a ladder-type filter and a double-mode-type filter integrally in a single package body.

Further, the present invention is not limited to the embodiments described previously but various variations and modifications may be made without departing from the scope of the invention.

What is claimed is:

1. A surface-acoustic-wave device, comprising:
  a piezoelectric substrate;
  an electrode pattern provided on a principal surface of said piezoelectric substrate, said electrode pattern forming a ladder-type surface-acoustic-wave filter;
  and a package body accommodating therein said piezoelectric substrate,
  said package body comprising: a bottom part carrying said piezoelectric substrate in a face-down state; and a side wall part laterally surrounding said piezoelectric substrate on said bottom part, said bottom part and said side wall part forming together a depression accommodating therein said piezoelectric substrate,
  said bottom part carrying a wiring pattern for electrical connection with said electrode pattern,
  said wiring pattern including a first ground pattern and a second ground pattern, lying generally in a common plane and in a mutually separated relationship within said plane on said bottom part, said first ground pattern and said second ground pattern being connected electrically with each other.

2. A surface-acoustic filter device as claimed in claim 1, wherein said piezoelectric substrate carries, on said principal surface, an input electrode, an output electrode, at least a pair of serially connected resonators connected between said input and output electrodes in series, an input-side parallel resonator shunting said input electrode to a ground, an output-side parallel resonator shunting said output electrode to a ground, and an intermediate parallel resonator shunting said pair of serially connected resonators commonly to a ground, an input-side ground electrode grounding said input-side parallel resonator, an output-side ground electrode grounding said output-side parallel electrode, and a plurality of electrodes including an intermediate ground electrode for grounding said intermediate parallel electrode, said piezoelectric substrate being flip-chip mounted on said bottom part such that said input-side ground electrode and said output-side ground electrode make an engagement with said first ground pattern and such that said intermediate ground electrode makes an engagement with said second ground pattern.

3. A surface-acoustic-wave device as claimed in claim 1, wherein said side wall part has an engaging surface adapted for engagement with a conductive cap member covering said depression, said engaging surface carrying thereon a conductive seal ring engaging with said conductive cap member when said conductive cap member is mounted on said engaging surface so as to cover said depression, said conductive seal ring being electrically connected to said first and second ground patterns.

4. A surface-acoustic-wave device, comprising:
  a piezoelectric substrate;
  an electrode pattern provided on a principal surface of said piezoelectric substrate, said electrode pattern forming a ladder-type surface-acoustic-wave filter;
  and a package body accommodating therein said piezoelectric substrate,
  said package body comprising: a bottom part carrying said piezoelectric substrate in a face-down state; and a side wall part laterally surrounding said piezoelectric substrate on said bottom part, said bottom part and said side wall part forming together a depression accommodating therein said piezoelectric substrate,
  said bottom part carrying a wiring pattern for electrical connection with said electrode pattern,
  said wiring pattern including a first ground pattern and a second ground pattern, lying generally in a common plane and in a mutually separated relationship within said plane on said bottom part,
  said first ground pattern and said second ground pattern being connected with each other electrically via an inductance.

5. A surface-acoustic-wave device as claimed in claim 4, wherein said inductance is optimized for maximum off-band spurious peak suppression.

6. A surface-acoustic-wave device as claimed in claim 4, wherein said side wall part has an engaging surface adapted for engagement with a conductive cap member covering said depression, said engaging surface carrying thereon a conductive seal ring engaging with said conductive cap member when said conductive cap member is mounted on said engaging surface so as to cover said depression, said conductive seal ring being electrically connected to one of said first and second ground patterns.

7. A surface-acoustic-wave device as claimed in claim 1, wherein said wiring pattern includes a stacking of a plurality of conductive layers.

8. A surface-acoustic-wave device as claimed in claim 1, wherein each of said plurality of electrodes includes a stacking of a plurality of bump electrodes.

9. A surface-acoustic-wave device as claimed in claim 1, wherein at least one of an input electrode pattern and an output electrode pattern constituting said wiring pattern is formed on a part of said bottom part between said first ground pattern and said second ground pattern.

10. A surface-acoustic-wave device, comprising:
  a package body having a mounting surface;
  a piezoelectric substrate mounted on said mounting surface in a face-down state; and
  a plurality of electrode patterns each forming a ladder-type surface-acoustic-wave filter provided on a principal surface of said piezoelectric substrate facing said mounting surface in a state in which said piezoelectric substrate is mounted on said mounting surface; wherein
  each of said plurality of electrode patterns includes a plurality of ground electrodes on said principal surface; and said mounting surface comprises a respective ground pattern for each of said plurality of electrode patterns, and each ground pattern is electrically connected to all of the ground electrodes of the electrode pattern respectively coupled thereto.

11. A surface-acoustic-wave device as claimed in claim 10, wherein said ground patterns corresponding to said electrode patterns are electrically isolated on said mounting surface.

12. A surface-acoustic-wave device, comprising:

a package body having a mounting surface;

a piezoelectric substrate mounted on said mounting surface in a face-down state;

a first electrode pattern provided on a principal surface of said piezoelectric substrate facing said mounting surface in said face-down state of said piezoelectric substrate, said first electrode pattern forming a ladder-type filter; and a second electrode pattern provided on said principal surface of said piezoelectric substrate facing said mounting surface in said face-down state of said piezoelectric substrate, said second electrode pattern forming a double-mode-type filter;

each of said first and second electrode patterns including a plurality of ground electrodes formed on said principal surface, said mounting surface carrying a first ground pattern making a contact commonly with said plurality of ground electrodes of said first electrode pattern, said mounting surface further carrying a plurality of mutually separated second ground patterns each making an electrical contact with a corresponding one of said plurality of ground electrodes of said second electrode pattern.

* * * * *